(12) United States Patent
Okayasu (10) Patent No.: US 6,396,610 B1
(45) Date of Patent: May 28, 2002

(54) SEMICONDUCTOR INTEGRATED CIRCUIT

(75) Inventor: Toshiyuki Okayasu, Kitakatsushika-gun (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/041,960

(22) Filed: Mar. 13, 1998

(30) Foreign Application Priority Data

Mar. 14, 1997 (JP) .............................................. 9-060905

(51) Int. Cl.[7] ........................ H04B 10/00; H04B 10/04; H04B 10/06
(52) U.S. Cl. ...................................... 359/163; 359/154
(58) Field of Search ................................ 359/128, 117, 359/152, 129, 180, 153, 163, 189, 184, 173; 257/1; 250/214 A; 385/19; 372/38

(56) References Cited

U.S. PATENT DOCUMENTS

| | | | | |
|---|---|---|---|---|
| 4,899,344 A | * | 2/1990 | Shibata ........................ | 372/29 |
| 4,992,677 A | * | 2/1991 | Ishibashi .................... | 307/443 |
| 5,060,306 A | * | 10/1991 | Nakamura .................. | 359/173 |
| 5,410,275 A | * | 4/1995 | Black .......................... | 330/228 |
| 5,444,410 A | * | 8/1995 | Polhemus ................... | 327/317 |
| 5,552,730 A | * | 9/1996 | Deguchi ..................... | 327/103 |
| 5,796,767 A | * | 8/1998 | Aizawa ........................ | 372/38 |
| 5,912,751 A | * | 7/1999 | Ford ........................... | 359/128 |
| 5,978,401 A | * | 11/1999 | Morgan ....................... | 372/50 |

OTHER PUBLICATIONS

Okayasu, T. Ultra Hi–Speed Pin–Electronics and Test Station Using GaAs IC, International Test Conference, 1994, pp 683–690.*

* cited by examiner

Primary Examiner—Leslie Pascal
Assistant Examiner—Agustin Bello
(74) Attorney, Agent, or Firm—Staas & Halsey LLP (57) ABSTRACT

A semiconductor integrated circuit is provided in which a space for accommodating a light emitting element driver circuit or a current detector circuit for detecting a current from a light receiving element can be reduced even if the number of channels connecting between a plurality of devices each having a semiconductor integrated circuit used therein. A signal source circuit 21, a light emitting element driver circuit 22 for supplying a signal outputted from the signal source circuit to a light emitting element 11 as a drive signal, and a light emitting element connecting terminal 23 connected to the output end of the driver circuit are integrally formed on one semiconductor chip of CMOS structure which is used as a semiconductor integrated circuit 20 of the transmitting side device A. A light receiving element connecting terminal 33 supplied with a current outputted from a light receiving element 15, a current detector circuit 32 the input end of which is connected to the connecting terminal, and a signal processing circuit 31 for receiving a signal outputted from the current detector circuit to process it in a predetermined manner are integrally formed on one semiconductor chip of CMOS structure which is used as a semiconductor integrated circuit 30 of the receiving side device B.

21 Claims, 8 Drawing Sheets

SEMICONDUCTOR INTEGRATED CIRCUIT

BACKGROUND OF THE INVENTION

1. Field of the Invention

The present invention relates to a semiconductor integrated circuit which can be suitably used in case that two devices, for example, are connected with each other through an optical transmission path or line and an optical signal is transmitted between the two devices (an optical signal is sent from one to the other or received by any one of them) over the optical transmission path to operate one or both of the devices.

2. Description of the Related Art

Many of semiconductor device testing apparatus (commonly called IC tester) for testing various types of semiconductor devices including semiconductor integrated circuits (IC) have a semiconductor device transporting and handling apparatus (commonly called handler) connected thereto for transporting various types of semiconductor devices to be tested (commonly called DUTS) to a test section for testing them, and carrying the tested semiconductor devices out of the test section for transport to a desired location. In such type of the semiconductor device testing apparatus, the section thereof called "test head" which is disposed in the test section of the handler is formed separately from the testing apparatus proper, and a signal transmission path or line such as a cable connects therebetween.

The testing apparatus proper and the test head have a semiconductor integrated circuit used therein, respectively, and the operation rate or speed of a semiconductor device which is testable by the testing apparatus is determined depending upon the transmission rate of a signal transmitting between them. In other words, if the transmission rate of a signal transmitting between the testing apparatus proper and the test head cannot be made high, it is impossible to test a semiconductor device having high operating speed or rate.

It is needless to say that the more the transmission rate of a signal transmitting between not only the semiconductor device testing apparatus proper and the test head but also two devices each having a semiconductor integrated circuit used therein is made high, the more it is desirable. For this end, recently, an optical signal is used as a signal transmitting between a plurality of devices each having a semiconductor integrated circuit used therein to make the transmission rate of the signal high.

Figure 12:
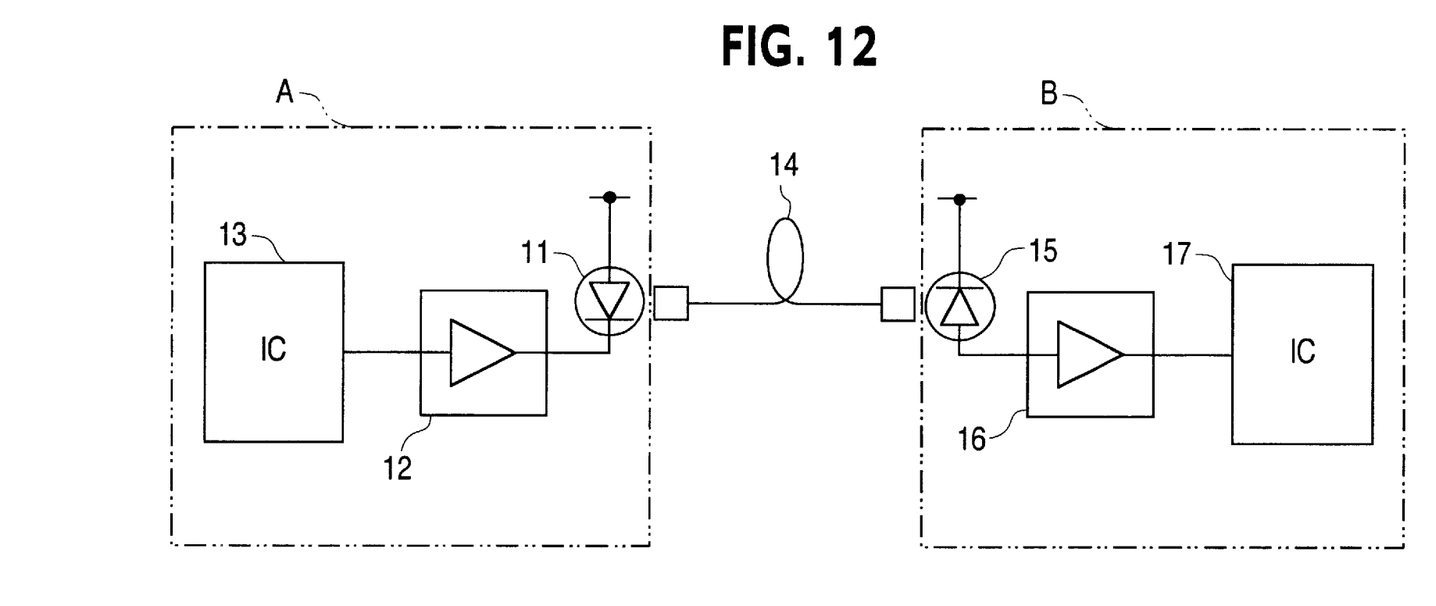
FIG. 12 is a block diagram showing circuit constructions of the transmitting side device and the receiving side device each having a conventional semiconductor integrated circuit used therein.

FIG. 12 is a block diagram showing one circuit construction of the conventional transmitting side device and the conventional receiving side device adopted in case of transmitting an optical signal between two devices each having a semiconductor integrated circuit used therein. This case shown in FIG. 12 is one in which data (a signal) is transmitted by use of an optical signal from the transmitting side device A to the receiving side device B. The transmitting side device A comprises a light emitting element 11 such as a laser diode, a light emitting diode or the like, a light emitting element driver circuit 12 for supplying a drive signal to the light emitting element 11, and a semiconductor integrated circuit 13 for supplying data (a pulse signal for example) to be transmitted to the light emitting element driver circuit 12.

The receiving side device B comprises a light receiving element 15 such as a photodiode, phototransistor or the like, a current detector circuit 16 for detecting an output current from the light receiving element 15 to convert it into data corresponding to the original data, and a semiconductor integrated circuit 17 for receiving an output signal from the current detector circuit 16 tc process it in a predetermined manner. The transmitting side device A and the receiving side device B are optically connected with each other by an optical transmission path or line 14 formed by an optical fiber. Usually, a PIN photodiode or avalanche photodiode (APD) is used as the light receiving element 15.

In the construction mentioned above, when data to be transmitted is applied to the light emitting driver circuit 12 from the semiconductor integrated circuit 13 which forts a signal source in the transmitting side device A, the light emitting element driver circuit 12 applies a drive signal corresponding to this data to the light emitting element 11 where the data is converted into an optical signal. The optical signal is transmitted through the optical transmission path 14 to the receiving side device B in which the light receiving element 15 converts the received optical signal into a current signal. The current signal is detected by the current detector circuit 16 which converts it into data corresponding to the original data. The data is given to the semiconductor integrated circuit 17 to process it in a predetermined manner.

Generally, there are often the cases a semiconductor integrated circuit is constituted by a plurality of CMOSs (Complementary Metal-Oxide Semiconductor) because a CMOS structure integrated circuit can be manufactured with high degree or high density in integration so that it can be miniaturized, the manufacture thereof is easy, the power consumption thereof is little, and it can be manufactured by low cost. In FIG. 12, the semiconductor integrated circuits 13 and 17 (they are Large Scale Integrated circuits, in this example) are constituted by many CMOSs, respectively. On the contrary, the light emitting driver circuit 12 and the current detector circuit 16 are constituted by a plurality of bipolar transistors, GaAs field effect transistors or the like suitable for high speed operation, respectively.

Heretofore, the purpose of signal transmission has been directed to a long-distance and high density transmission of signals such as, for instance, signal transmission in a main line or trunk line system of a communication network. For this end, it is necessary to carry information content as much as possible on one optical fiber, and hence high rate signal transmission of several Gbps (gigabits/sec) to several tens Gbps per one optical fiber is requested. As a result, bipolar transistors, GaAs field effect transistors or the like suitable for high speed operation have been inevitably used in the past.

Accordingly, as shown in FIG. 12, in addition to the semiconductor integrated circuits 13 and 17, the light emitting element driver circuit 12 and the current detector circuit 16 are provided in the transmitting side device A and the receiving side device B separately from the semiconductor integrated circuits 13 and 17, respectively. Consequently, there are needed additional spaces for accommodating the light emitting element driver circuit 12 and the current detector circuit 16 on the semiconductor chips on which the semiconductor integrated circuit 13 and 17 are formed, respectively. Moreover, there is a necessary to connect between the semiconductor integrated circuit 13 and the light emitting element driver circuit 12 and between the semiconductor integrated circuit 17 and the current detector circuit 16 by outer conductive paths, respectively, which results in a defect that power consumption is considerably increase.

In particular, in case that many optical transmission paths of several hundred to several thousand channels are provided between the transmitting side device A and the receiving side device B, spaces for accommodating the light emitting element driver circuits 12 and the current detector circuits 16 and the amount of power consumption are increased more and more with the number of channels increased. As a result, riot only the power consumption is greatly increased but also a large space is needed, and hence it is a big obstacle in miniaturizing the transmitting side device A and the receiving side device B.

However, in case of a short-distance and parallel data transmission as in the semiconductor device testing apparatus described before, or between frames or racks or in a frame or rack of a parallel computer or the like, the transfer or transmission rate is 1 to 2 Gbps at its maximum, but a great number of signals must be treated. In addition, such apparatus of the type transmitting an optical signal must has its size, power consumption, price, and the like equal to or lower than those of the conventional apparatus of the type transmitting an electrical signal. For this reason, the semiconductor integrated circuits are required to have a small size, low power consumption and low price. Consequently, it is necessary to use semiconductor integrated circuits of CMOS structure which are now the main products in large scene integrated circuits. Moreover, the light emitting element driver circuit and the current detector circuit must be formed in associated integrated circuits of CMOS structure integrally therewith, respectively.

SUMMARY OF THE INVENTION

An object of the present invention is to provide a semiconductor integrated circuit in which a space for accommodating a light emitting element driver circuit or a current detector circuit can be reduced even if the number of channels connecting between a plurality of devices each having a semiconductor integrated circuit used therein.

An another object of the present invention is to provide a semiconductor integrated circuit in which a semiconductor integrated circuit serving as a signal source and a light emitting element driver circuit are formed as a semiconductor integrated circuit of one chip having CMOS structure and a current detector circuit and a semiconductor integrated circuit serving to process a signal are formed as a semiconductor integrated circuit of one chip having CMOS structure thereby making electric power relating to signal transmission between these circuits substantially zero, resulting in much reduction of power consumption.

In the first aspect of the present invention, there is provided a semiconductor integrated circuit wherein a signal source circuit for generating a signal to be transmitted, a light emitting element driver circuit for supplying a signal outputted from the signal source circuit to a light emitting element disposed at a position outside the semiconductor integrated circuit as a drive signal, and a light emitting element connecting terminal connected to the output end of the light emitting element driver circuit and to which the light emitting element is connected are integrally formed on one semiconductor chip.

Also, there is provided a semiconductor integrated circuit wherein a light receiving element connecting terminal supplied with a current outputted from a light receiving element disposed at a position outside the semiconductor integrated circuit, a current detector circuit the input end of which is connected to the light receiving element connecting terminal, and a signal processing circuit for receiving a signal outputted from the current detector circuit to process it in a predetermined manner are integrally formed on one semiconductor chip.

In a preferred embodiment, the semiconductor chip is constituted by CMOSs.

According to the construction of the present invention as mentioned above, since the arrangement is such that the light emitting element driver circuit or the current detector circuit is integrally built in the semiconductor integrated circuit serving as a signal source or the semiconductor integrated circuit constituting a signal processing circuit, the transmitting side device or the receiving side device is completed only by connecting a light emitting element or a light receiving element to the light emitting element connecting terminal or the light receiving element connecting terminal provided in the semiconductor integrated circuit. Therefore, the transmitting side device or the receiving side device is constituted by parts of the semiconductor integrated circuit and the light emitting element or the semiconductor integrated circuit and the light receiving element, resulting in decreasing the occupation of a space. In addition, by forming the light emitting element driver circuit or the current detector circuit in the associated semiconductor integrated circuit of CMOS structure, The transmitting side device or the receiving side device can be miniaturized, and power consumption can be reduced.

In the second aspect of the present invention, there is provided a semiconductor integrated circuit wherein a signal source circuit for generating a signal to be transmitted, a light emitting element driver circuit for supplying a signal outputted from the signal source circuit to a light emitting element disposed at a position outside the semiconductor integrated circuit as a drive signal, a light emitting element connecting terminal connected to the output end of the light emitting element driver circuit and to which the light emitting element is connected, a light receiving element connecting terminal supplied with a current outputted from a light receiving element disposed at a position outside the semiconductor integrated circuit, a current detector circuit the input end of which is connected to the light receiving element connecting terminal, and a signal processing circuit for receiving a signal outputted from the current detector circuit to process it in a predetermined manner are integrally formed on one semiconductor chip.

In a preferred embodiment, a plurality of the light emitting element driver circuits, a plurality of the light emitting element connecting terminals, a plurality of the signal source circuits, a plurality of the light receiving element connecting terminal, a plurality of the current detector circuit, and a plurality of the signal processing circuit are provided. In addition, the semiconductor chip is constituted by CMOSs.

In the third aspect of the present invention, there is provided a semiconductor integrated circuit wherein in a device for transmitting a signal inputted to a semiconductor integrated circuit and a signal outputted from the integrated circuit to be transmitted to an other circuit by use of an optical signal, a light emitting element driver circuit and a detector circuit for detecting a current outputted from a light receiving element both of which are used in transmitting the optical signal are integrally formed on one semiconductor chip.

It is preferred that the semiconductor chip is constituted by CMOSs.

DETAILED DESCRIPTION OF THE PREFERRED EMBODIMENTS

Now, some embodiments of the semiconductor integrated circuit according to the present invention will be described in detail with reference to FIGS. 1 to 11.

Figure 1:
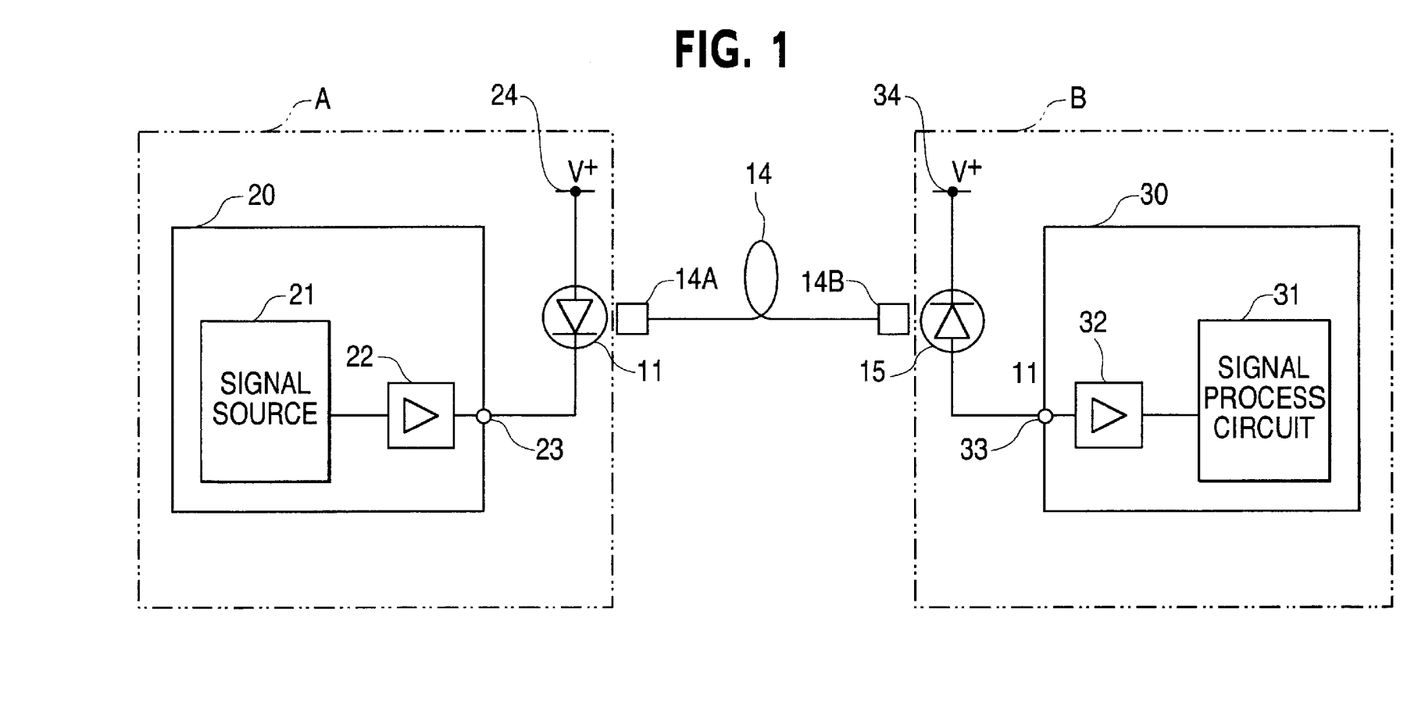
FIG. 1 is a block diagram showing circuit constructions of the transmitting side device and the receiving side device each having a first embodiment of the semiconductor integrated circuit according to the present invention used therein.

FIG. 1 is a block diagram showing a general circuit construction of two devices each having a first embodiment of the semiconductor integrated circuit according to the present invention used therein. The illustrated case is one in which a device A is used as a transmitting side device and a device B is used as a receiving side device, and an optical signal is transmitted from the device A to the device B where a received signal is processed.

For this purpose, a semiconductor integrated circuit 20 of the first embodiment of the present invention and a light emitting element 11 are provided in the transmitting side device A, and in the receiving side device, a light receiving element 15 and a semiconductor integrated circuit 30 of the first embodiment of the present invention are provided. In addition, the device P is connected with the device B by an optical transmission path 14 constituted by, for example, an optical fiber through a transmitting side optical connector 14A and a receiving side optical connector 14B. Further, in this example, the semiconductor integrated circuits 20 and 30 are large scale integrated circuits each of which has CMOS structure.

The semiconductor integrated circuit 20 of the first embodiment of the present invention provided in the transmitting side device A comprises a signal source circuit 21 for generating a signal (data) to be transmitted to the receiving side device B and a light emitting element driver circuit 22 for supplying a drive signal to the light emitting element 11, the signal source circuit 21 and the light emitting element driver circuit 22 being formed in the same semiconductor chip. In addition, the integrated circuit 20 has a light emitting element connecting terminal 23 formed therein and connected to the output terminal of the light emitting element driver circuit 22. Consequently, wiring of the transmitting side device A is completed only by connecting the light emitting element 11 between the light emitting element connecting terminal 23 and a positive power supply or source terminal (V+) 24.

On the other hand, the semiconductor integrated circuit 30 of the first embodiment of the present invention provided in the receiving side device B a current detector circuit 32 for detecting a current outputted from the light receiving element 15 to convert it into a signal (data) corresponding to the original signal (data) and a signal processing circuit 31 for receiving a signal outputted from the current detector circuit 32 to process it in a predetermined manner, the current detector circuit 32 and the signal processing circuit 31 being formed in the same semiconductor chip. In addition, the integrated circuit 30 has a light receiving element connecting terminal 33 formed therein and connected to the input terminal of the current detector circuit 32. Consequently, wiring of the receiving side device B is completed only by connecting the light receiving element 15 between the light receiving element connecting terminal 33 and a positive power supply or source terminal (V+) 34.

Figure 2:
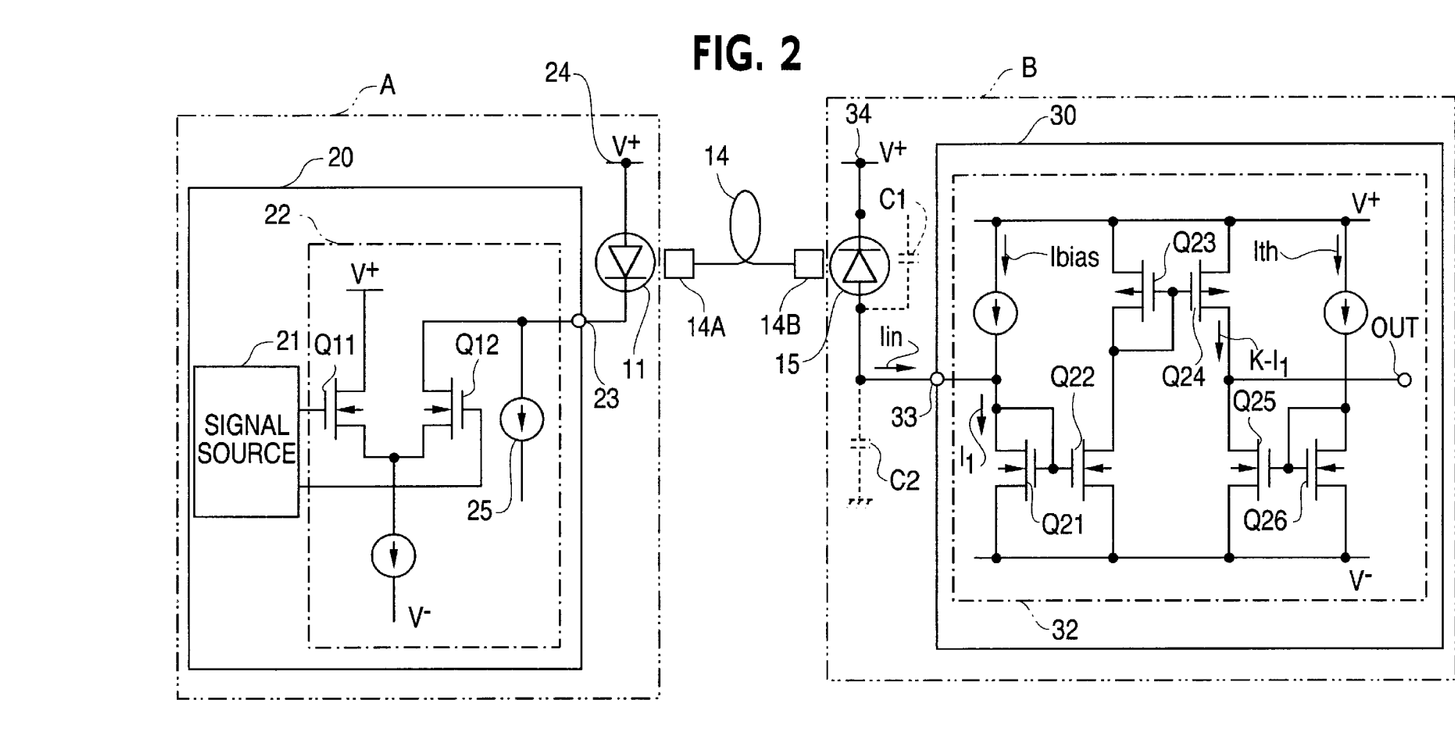
FIG. 2 is a schematic diagram showing specific examples of the light emitting element driver circuit of the transmitting side device and the current detector circuit of the receiving side device shown in FIG. 1, respectively.

FIG. 2 shows specific or concrete examples of the light emitting element drover circuit 22 of the semiconductor integrated circuit 20 provided in the transmitting side device A and the current detector circuit 32 of the semiconductor integrated circuit 30 provided in the receiving side device 3, respectively.

As was already described, singe the integrated circuits 20 and 30 of this embodiment are integrated circuits each having CMOS structure, the light emitting element driver circuit 22 and the current detector circuit 32 shown in FIGS. 2 to 10 are integrally formed in the integrated circuits having CMOS structure, respectively.

The light emitting element driver circuit 22 shown in FIG. 2 comprises two N-channel MOS field effect transistors (MOS·FETs; hereinafter, each referred to as transistor) Q11 and Q12 which are connected in differential operating manner. Specifically, sources of the first and the second N-channel transistors Q11 and Q12 are connected with each other and the junction thereof is connected to a negative power supply or source (V−) through a constant current circuit. One output of the signal source circuit 21 is connected to gate of the first transistor Q11 and the other output thereof is connected to gate of the second transistor Q12. Drain of the first transistor Q11 is connected to a positive power supply or source (V+) and drain of the second transistor Q12 is connected to the light emitting element connecting terminal 23.

In the circuit construction stated above, in order that the light emitting element 11 comes to the inactive state, namely, the state not emitting light, it is necessary that the first transistor Q11 is turned on and the second transistor Q12 is held off or non-conductive. In this state, if differentially varying signals are supplied to gates of the first and the second transistors from the signal source circuit 21 so that the first transistor Q11 is turned off, concurrently the second transistor Q12 is turned on so that a drive current flows from the positive power supply terminal 24 (V+) through the light emitting element 11 and the second transistor Q12 to the negative power supply (V−), thereby to cause the light emitting element 11 to emit light.

In such way, in case the light emitting element 11 is driven by the differential type current switch circuit constituted by two MOS field effect transistors, it is possible to cause the light emitting element 11 to emit light by only an operation that the current flowing through the first transistor Q11 is switched to flow through the second transistor Q12, and hence the rising of the current flowing through the light emitting element 11 is fast and high rate (speed) operation can be attained.

Further, a constant current circuit 25 connected to the light emitting element connecting terminal 23 is provided for giving a constant bias current to the light emitting element 11. In other words, if the light emitting element 11 be a laser diode for example, the constant current circuit 25 is one which gives to the laser diode a current near its threshold value to emit light as its bias current so that the laser diode can emit light instantaneously when a current flows through the second transistor Q12, namely, a circuit for instantaneously varying the amount of emitting light of the laser diode.

The current detector circuit 32 provided in the receiving side device B comprises a first current mirror circuit constituted by first and second N-channel MOS field effect transistors (hereinafter, each referred to as transistor) Q21 and Q22, a second current mirror circuit constituted by third and fourth P-channel MOS field effect transistors thereinafter, each referred to as transistor) Q23 and Q24, and a third current mirror circuit constituted by fifth and sixth N-channel MOS field effect transistors (hereinafter, each referred to as transistor) Q25 and Q26.

Each pair of transistors Q21 and Q22, Q23 and Q24, Q25 and Q26 of each of the current mirror circuits have their gates connected with each other, and the interconnected gates of the first current mirror circuit is connected to drain of the first transistor Q21 as well as connected to a positive power supply or source (V+) through a constant current circuit (bias current Ibias), the interconnected gates of the second current mirror circuit is connected to source of the third transistor Q23, and the interconnected gates of the first current mirror circuit is connected to drain of the sixth transistor Q26 as well as connected to the positive power supply (V+) through a constant current circuit (reference current Ith). In addition, sources of the transistor pair of thp first current mirror circuit and the transistor pair of the third current mirror circuit are connected to a negative power supply or source (V−) respectively, and drains of the transistor pair of the second current mirror circuit are connected to the positive power supply (V+) respectively.

Drain of the first transistor Q21 is connected to the light receiving element connecting terminal 33, drain of the second transistor Q22 is connected to source of the third transistor Q23, source of the fourth transistor Q24 is connected to drain of the fifth transistor Q25, and further, the output terminal OUT of the current detector circuit 32 is connected to the junction of source of the fourth transistor Q24 and drain of the fifth transistor Q25.

The teature of this current detector circuit 32 is that it is arranged such that its input impedance is reduced as low as possible. In other words, to lower the input impedance results in decrease in the effect or influence caused by a capacitance C1 (shown by broken line) existing between anode and cathode of the light receiving element 15 and a capacitance C2 (shown by broken line) existing between the light receiving element connecting terminal 33 and the common potential point (ground potential). As a result, the circuit can be arranged to operate at high rate or speed.

The current detector circuit 32 operates as a current comparator circuit which compares the reference current Ith given to the third current mirror circuit (transistors Q25, Q26) with a current $I_1$ flowing through the first transistor Q21 of the first current mirror circuit, thereby to output a pulse signal P from the output terminal OUT, the current $I_1$ being the sum of an output current $I_{in}$ of the light receiving element 15 and a bias current Ibias given to the first current mirror circuit (transistors Q21, Q22).

Figure 3:
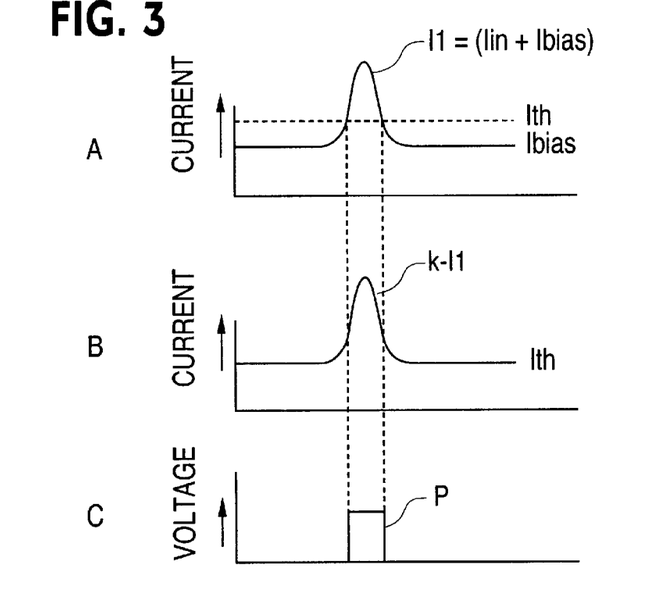
FIG. 3 is waveforms explaining the operations of the light emitting element driver circuit and the current detector circuit shown in FIG. 2.

Explaining with reference to FIG. 3, as shown in FIG. 3A, when the current $I_1$ flowing through the first transistor Q21 exceeds the reference current Ith, a current $K \cdot I_1$ flowing through the fourth transistor Q24 is also increased as shown in FIG. 3B, and hence the potential at the output terminal OUT rises, which results in a pulse P shown in FIG. 3C outputted to the output terminal OUT. Further, the foregoing is described assuming that ratio of each of the current mirror circuits is 1 (one), but it is needless to say that the ratio of each current mirror circuit may be varied.

In the current detector circuit 32 shown in FIG. 2, if there is any deviation in manufacture in respect to characteristics of P-channel transistors (Q23, Q24) and N-channel transistors (Q21, Q22, Q25, Q26) among transistors used therein, or there is any relative difference between them due to change in environmental temperature, it is possible that the tiring accuracy is affected. To eliminate such defect, as is apparent from FIG. 2, the illustrated circuit is arranged such that it has symmetricalness to the utmost. As a result, pair relation or characteristic between the constant current sources giving the constant reference current Ith and the constant bias current Ibias respectively as well as pair relation or characteristic between the first current mirror circuit constituted by the first and the second transistors Q21 and Q22 and the second current mirror circuit constituted by the fifth and the sixth transistors Q25 and Q26 are good and the ratio characteristics of them are maintained even though any deviation in manufacture or any change in environmental temperature occurs. Accordinqly, the yield of such current detector circuits without adjusting them is satisfactory and they are stable against any chance in their operating environments so that the timing accuracy is held high.

Figure 4:
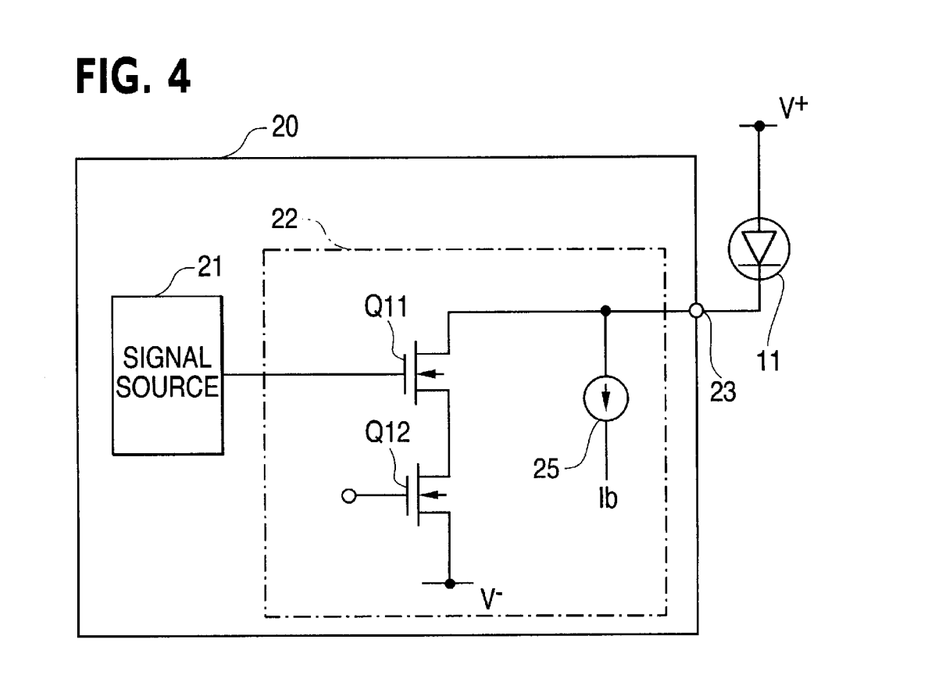
FIG. 4 is a schematic diagram showing a first modification of the light emitting element driver circuit of the transmitting side device shown in FIG. 2.

FIGS. 4 to 7 show first to fourth modifications of the light emitting element driver circuit 22 respectively. FIG. 4 shows the first modification of the light emitting element driver circuit 22 which has simpler circuit construction than that of the light emitting element driver circuit 22 shown in FIG. 2. In the first modification, the first and the second transistors Q11 and Q12 are connected in series between the light emitting element connecting terminal 23 and the negative power supply (V−), the output of the signal source circuit 21 is connected to gate of the first transistor Q11, and to gate of the second transistor Q12 is applied a bias voltage for controlling the drive current flowing through the light emitting element 11. Therefore, the first transistor Q11 functions as a current switch, and the second transistor Q12 serves as a variable resistor for setting the value of the drive current flowing through the first transistor Q11 to any desired value.

In accordance with the circuit construction of the first modification mentioned above, singe no constant current source is needed to be connected to sources of both the trarsistors, it is simpler in construction than that of the fight emitting element driver circuit 22 shown in FIG. 2, and hence there is obtained an advantage that the area occupied thereby on the integrated circuit 20 can be decreased.

Moreover, the first transistor Q11 turns on only when the light emitting element 11 is driven to emit light, and thereby, a drive current flows through the light emitting element 11. As a result, an advantage is also obtained that the power consumption thereof is lower thar that of the light emitting element driver circuit 22 shown ir FIG. 2.

Figure 5:
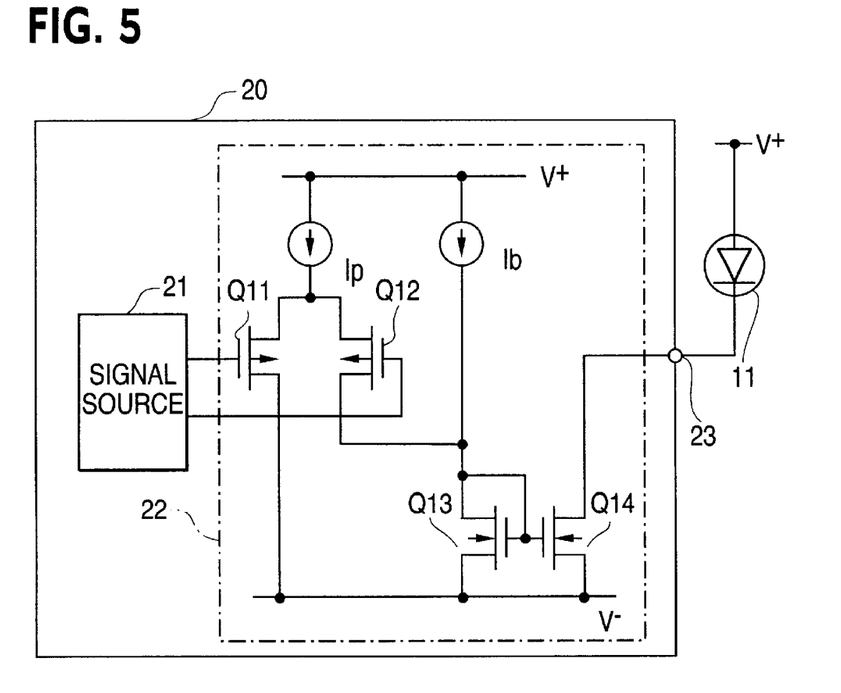
FIG. 5 is a schematic diagram showing a second modification of the light emitting element driver circuit of the transmitting side device shown in FIG. 2.

The second modification of the light emitting element driver circuit 22 shown in FIG. 5 is one which is effective in case the power supply voltage is desired to be lowered.

In this second modification, P-channel MOS field effect transistors (hereinafter, each referred to as transistor) are used as the first and the second transistors Q11 and Q12. Drains of both the transistors Q11 and Q12 are connected with each other, and the junction thereof is connected to the positive power supply (V+) through a constant current source (Ip), and source of the first transistor Q11 is connected to the negative power supply (V−).

In addition, there are provided third and fourth N-channel MOS field effect transistors (hereinafter, each referred to as transistor) Q13 and Q14 which constitute a current mirror circuit. Gates of them corrected with each other are connected to the positive power supply (V+) through a constant current source (Ib) as well as connected to drain of the third transistor Q13. In addition, sources of the third and the fourth transistors Q13 and Q14 are connected to the negative power supply (V−), drain of the fourth transistor Q14 is connected to the light emitting element connecting terminal 23, and source of the second transistor Q12 is connected to drain of the third transistor Q13.

In accordance with the circuit construction of the seccnd modification mentioned above, between the positive power supply (V+) and the negative power supply (V−) are connected in series the light emitting element 11 and the fourth transistor Q14, and the positive power supply voltage V+ and the negative power supply voltage V− are applied across the series combination of the light emitting element 11 and the fourth transistor Q14. The forward voltage of the light emitting element 11 is about 1 to 2 volts, and the power supply voltage of the integrated circuit 20 of CMOS structure is 2.5 volt in case of $0.35\mu$ and 3.5 volt in case of $0.5\mu$. Accordingly, if there are used the light emitting element 11 having its forward voltage of 1.5 V and the integrated circuit of CMOS structure of $0.35\mu$ having its power supply voltage lower than that of $0.5\mu$, the positive power supply voltage V+ is 2.5 V and the negative power supply voltage V− is −2.5 V, and hence the potential difference therebetween is 5 V. As a result, the sum of the forward voltage 1.5 V of the light emitting element 11 and the power supply voltage 2.5 V of the integrated circuit of CMOS structure of $0.35\mu$ is 4.0 V, and the remainder voltage 1 V (5 V−4 V) can be used as drain-source voltage of the fourth transistor Q14, thereby operating the fourth transistor Q14 at high rate or speed.

In other words, it is difficult to operate at high rate field effect transistors of two stages connected in series as shown in FIG. 4, or field effect transistors of three or more stages connected in series by power supply voltage of 1 V. However, it is easy to operate at high rate one field effect transistor as shown in the modification of FIG. 5. Consequently, there occurs an advantage that an integrated circuit of CMOS structure having a low power supply voltage can be used.

Figure 6:
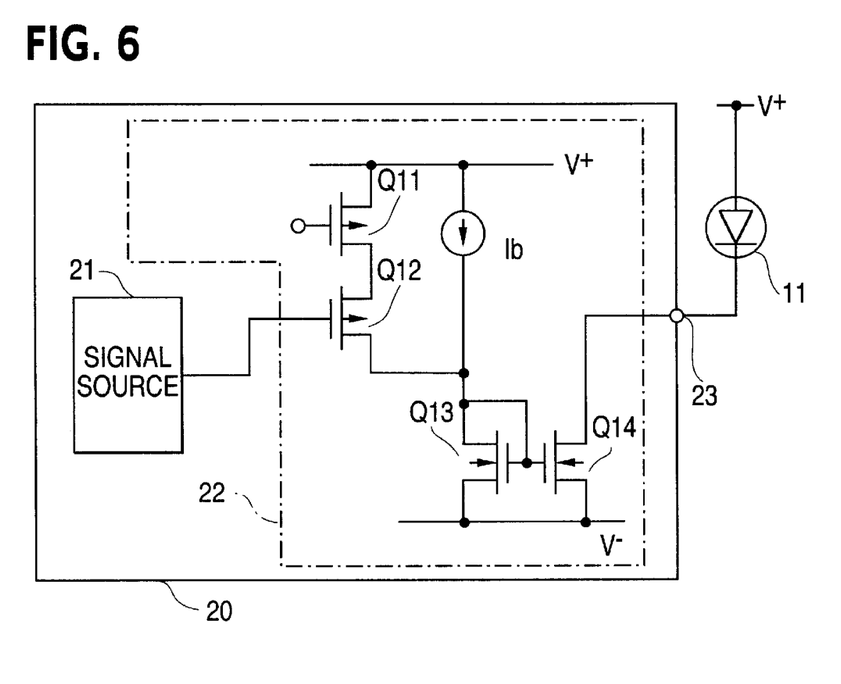
FIG. 6 is a schematic diagram showing a third modification of the light emitting element driver circuit of the transmitting side device shown in FIG. 2.

The third modification of the light emitting element driver circuit 22 shown in FIG. 6 is the combination of the features of the first and the second modifications shown in FIGS. 4 and 5. That is, in the second modification shown in FIG. 5, the first and the second P-channel transistors Q11 and Q12 are connected in series as in the nodification shcwn in FIG. 4, and the series combination of the transistors Q11 and Q12 is connected between the positive power supply (V+) and drain of the third transistor Q13.

In accordance with the circuit construction of the third modification described above, singe no constant current source is needed to be connected to drains of both the transistors, it is simpler in construction than that of the light emitting element driver circuit 22 shown in FIG. 5, and hence there is obtained an advantage that the area occupied thereby on the integrated circuit 20 can be decreased. Moreover, the second transistor Q12 turns on only when the light emitting element 11 is driven to emit light, and thereby, a drive current flows through the light emitting element 11. As a result, an advantage is also obtained that the power consumption thereof is lower than that of the light emitting element driver circuit 22 shown in FIG. 5.

Figure 7:
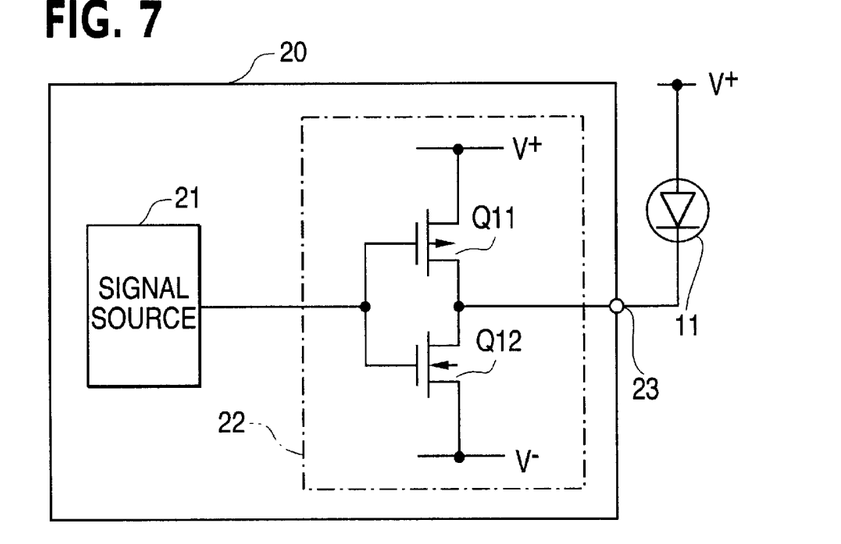
FIG. 7 is a schematic diagram showing a fourth modification of the light emitting element driver circuit of the transmitting side device shown in FIG. 2.

FIG. 7 shows the fourth modification of the light emitting element driver circuit 22 which is the simplest circuit construction thereof constituted by one CMOS in which a P-channel MOS field effect transistor is used as the first transistor Q11 and an N-channel MOS field effect transistor is used as the second transistor Q12. Gates of the transistors Q11 and Q12 are interconnected and the junction thereof is connected to the signal source circuit 21, and drains of the transistors Q11 and Q12 are interconnected and the junction thereof is connected to the light emitting element connecting terminal 23.

In accordance with the circuit construction of the fourth modification mentioned above, an advantage is obtained that it is easily driven by an inverter of CMOS structure. In addition, the circuit construction is simplified, and hence there is also obtained an advantage that the area occupied thereby on the integrated circuit 20 can be decreased. Moreover, there occurs an advantage that the power consumption thereof is lower than that of the light emitting element driver circuit 22 shown in FIG. 4. Therefore, it can be suitably applied to a case in which multi-charnel optical transmission paths or lines are provided between two devices.

Figure 8:
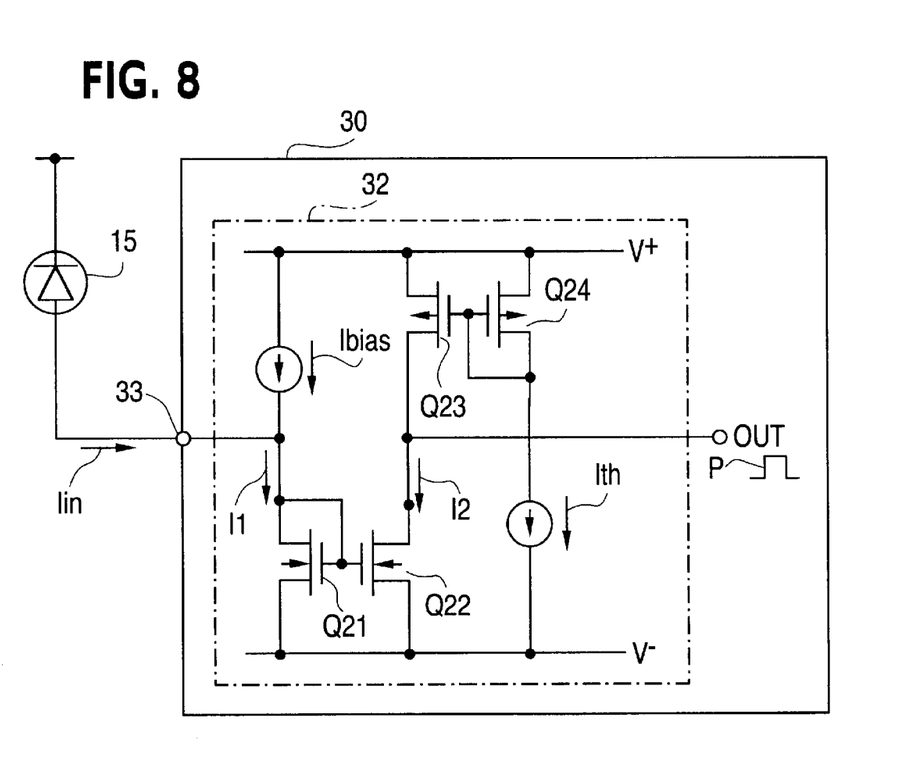
FIG. 8 is a schematic diagram showing a first modification of the current detector circuit of the receiving side device shown in FIG. 2.
Figure 9:
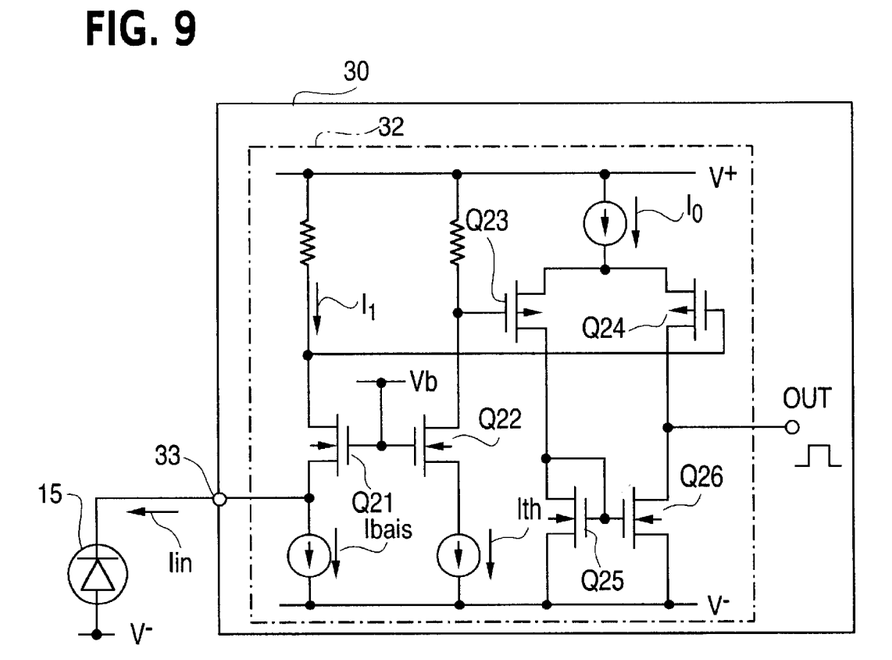
FIG. 9 is a schematic diagram showing a second modification of the current detector circuit of the receiving side device shown in FIG. 2.
Figure 10:
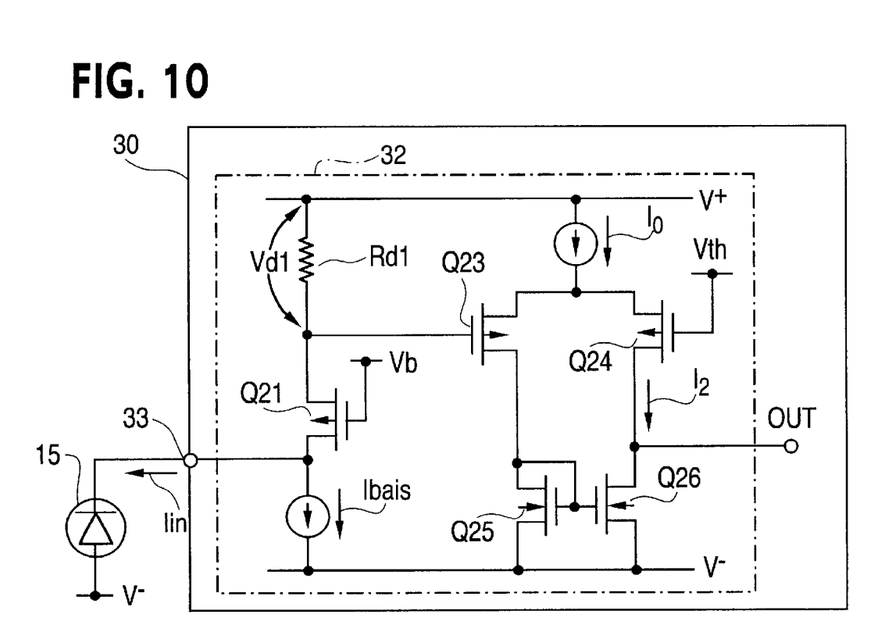
FIG. 10 is a schematic diagram showing a third modification of the current detector circuit of the receiving side device shown in FIG. 2.

FIGS. 8 to 10 show the first to third modifications of the current detector circuit 32 respectively. The current detector circuit 32 of the first modification shown in FIG. 8 is one which has a simpler circuit construction than that of the current detector circuit 32 shown in FIG. 2. That is, in this first modification, the third current mirror circuit (transistors Q25 and Q26) in FIG. 2 is eliminated and the interconnected gates of the transistor pair Q23 and Q24 of the second current mirror circuit are connected to source of the fourth transistor Q24 which is, in turn, connected to the negative power supply (V−) through a constant current circuit (reference current Ith). In addition, the output terminal OUT of the current detector circuit 32 is connected to the junction of drain of the second transistor Q22 and source of the third transistor Q23.

It is clear that in the circuit construction of the first modification stated above, too, when the current $I_1$ flowing through the first transistor Q21 of the first current mirror circuit is greater than the reference current Ith, a pulse signal P is outputted from the output terminal OUT, the current $I_1$ being the sum of an output current Iin of the light receiving element 15 and a bias current Ibias given to the first current mirror circuit (transistors Q21, Q22). Therefore, further explanation thereof will be omitted.

The second modification of the current detector circuit 32 shown in FIG. 9 shows a case in which resistors can be formed in the integrated circuit 30 of CMOS structure. Like the current detector circuit 32 shown in FIG. 2, this current detector circuit 32 of the second modification comprises a first current mirror circuit constituted by first and second N-channel MOS field effect transistors (hereinafter, each referred to as transistor) Q21 and Q22, a second current mirror circuit constituted by third and fourth P-channel MOS field effect transistors (hereinafter, each referred to as transistor) Q23 and Q24, and a third current mirror circuit constituted by fifth and sixth N-channel MOS field effect transistors (hereinafter, each referred to as transistor) Q25 and Q26.

Each of the transistor pairs Q21 and Q22, and Q25 and C26 of the first and the third current mirror circuits have their gates connected with each other, and the interconnected gates of the first current mirror circuit is connected to a bias voltage source or supply (Vb) of a predetermined value. Drain of the first transistor Q21 is connected to the positive power supply (V+) through a resistor as well as connected to gate of the fourth transistor Q24, and source of the first transistor Q21 is connected to the negative power supply (V−) through a constant current circuit (bias current Ibias) as well as connected to the light receiving element connecting terminal 33.

Drain of the second transistor Q22 is connected to the positive power supplv (V+) through a resistor as well as connected to gate of the third transistor Q23, and source of the second transistor 22 is connected to the negative power supply (V−) through a constant current circuit (reference current Ith). The interconnected gates of the third current mirror circuit is connected to drain of the fifth transistor Q25 as well as connected to source of the third transistor Q23, and sources of the transistor pair Q25 and Q26 are connected to the negative power supply (V−) respectively.

In addition, drains of the transistor pair Q23 and Q24 of the second current mirror circuit are interconnected and the junction thereof is connected to the positive power supply (V+) through a constant current circuit (reference current $I_0$), source of the fourth transistor Q24 is connected to drain of the sixth transistor Q26, and the output terminal OUT of the current detector circuit 32 is connected to the junction of source of the fourth transistor Q24 and drain of the sixth transistor Q26.

The first current mirror circuit consisting of the transistors Q21 and Q22 is a common-gate type circuit in which the input impedance thereof is lowered so as to reduce the effect or influence caused by a capacitance (C1) existing between anode and cathode of the light receiving element 15 and a capacitance (C2) existing between the light receiving element connecting terminal 33 and the common potential point (ground potential), thereby to make it possible to operate the circuit at high rate or speed. Further, the fifth and the sixth transistors Q25 and Q26 may be replaced by resistors. In case of replacing the transistors Q25 and Q26 by resistors, it is possible to operate the circuit at higher rate than the former circuit and a differential output can be obtained though the amplitude of the output signal is small.

It is apparent that in the second modification shown in FIG. 9, too, when the current $I_1$ (=Iin+Ibias) flowing through the first transistor Q21 is greater than the reference current Ith, a current flowing through the fourth transistor Q24 is increased, thereby to output a pulse signal P from the output terminal OUT. Therefore, further explanation thereof will be omitted.

The third modification of the current detector circuit 32 shown in FIG. 10 shows a case in which the reference voltage Vth is used in place of the reference current Ith used in the current detector circuits shown in FIGS. 2, 8 and 9. Therefore, the third modification is arranged such that the second transistor Q22 of the first current mirror circuit is eliminated (accordingly, the first current mirror circuit is eliminated), and drain of the first transistor Q21 is connected to the positive power supply (V+) through a resistor Rd1 as well as connected to gate of the third transistor Q23 of the second current mirror circuit, and gate of the fourth transistor Q24 is connected to the reference voltage source (Vth).

In the current detector circuit 32 of the third modification shown in FIG. 10, when the light receiving element 15 receives light so that the input current Iin is increased and a voltage Vd1 generated across the resistor Rd1 is decreased below the reference voltage Vth, a current flowing through the third transistor Q23 is decreased. As a result, a current $I_2$ flowing through the fourth transistor Q24 is increased. It is clear that the increase of the current $I_2$ results in outputting a pulse signal P from the output terminal OUT, and hence further explanation thereof will be omitted. In addition, in the third modification, like the modification shown in FIG. 9, the fifth and the sixth transistors Q25 and Q26 constituting the third current mirror circuit may be replaced by resistors.

Figure 11:
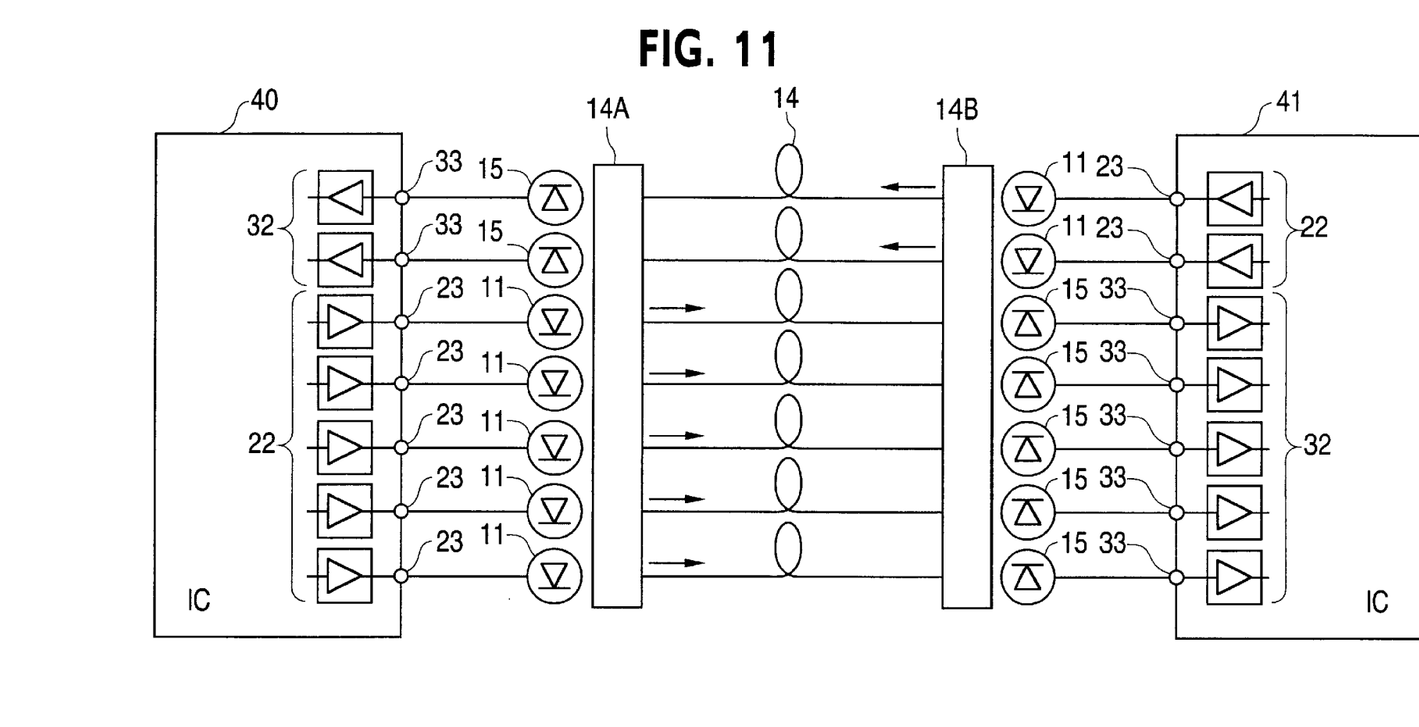
FIG. 11 is a block diagram showing circuit constructions of the transmitting side device and the receiving side device each having a second embodiment of the semiconductor integrated circuit according to the present invention used therein.

FIG. 11 shows the second embodiment of the semiconductor integrated circuit according to the present invention in which both of the light emitting element and the current detector circuit are formed in each of the semiconductor integrated circuits of the transmitting side and the receiving side devices. As shown in the drawing, the semiconductor integrated circuit 40 of the transmitting side device comprises a plurality of (five in this example) light emitting element driver circuits 22 and a plurality of (two in thus example) current detector circuits 32, the light emitting element driver circuits 22 and the current detector circuits 32 being formed as one semiconductor integrated circuit of CMOS structure. Also, the semiconductor integrated circuit 41 of the receiving side device comprises a plurality of (two in this example) light emitting element driver circuits 22 and a plurality of (five in this example) current detector circuits 32, the light emitting element driver circuits 22 and the current detector circuits 32 being formed as one semiconductor integrated circuit of CMOS structure.

In each of the integrated circuits 40 and 41, one light emitting element connecting terminal 23 is provided in each of the light emitting element drive circuits 22, and one light receiving element connecting terminal 33 is provided in each of the current detector circuits 32. One light emitting element 11 is connected to each of the light emitting element connectirg terminals 23, and one light receiving element 15 is connected to each of the light receiving element connecting terminals 33. In addition, an optical transmission path or line 14 such as an optical fiber connects between corresponding light emitting element 11 and light receiving element 15.

In accordance with the construction described above, it is possible that the number of parts or elements are considerably decreased and the power consumption is greatly reduced. Further, in the above construction, if a multiplicity of the Light emitting element driver circuits 22, the current detector circuits 32, the light emitting element connecting terminals 23 and the light receiving element connecting terminals 33 corresponding to several hundred channels are provided in each of the integrated circuits 40 and 41, an advantage is obtained that only by preparing several of such integrated circuit, a signal transmission in a semiconductor device testing apparatus, for example, between the testing apparatus proper and its test head can be performed As is apparent from the foregoing discussion, according to the present invention, even if a semiconductor integrated circuit is constituted by CMOSs, a light emitting element driver circuit or a current detector circuit is constructed such that it can be integrally formed in the associated integrated circuit, and hence it is unnecessary to provide the light emitting element driver circuit or the current detector circuit outside the associated integrated circuit separately therefrom. Accordingly, no additional space for accommodating the light emitting element driver circuit or the current detector circuit is prepared in the integrated circuit, and hence it is possible to miniaturize the transmitting side and the receiving side devices. Moreover, it is not needed to connect between the integrated circuit and the light emitting element driver circuit by an outer conductive path and between the integrated circuit and the current detector circuit by an outer conductive path. As a result, the power consumption can be considerably reduced.

In particular, in case a multiplicity of optical transmission paths or lines corresponding to several hundred to several thousand channels are provided between a transmitting side device and a receiving side device remarkable advantages occur that miniaturization of the devices and large amount of reduction in power consumption can be attained. Moreover, a further advantage is obtained that the costs of the transmitting side device and the receiving side device can be reduced by forming the light emitting element driver circuit and/or the current detector circuit integrally in the corresponding integrated circuits each having CMOS structure.

What is claimed is:

1. A semiconductor integrated circuit comprising:
   a signal source circuit generating a signal to be transmitted;
   a light emitting element driver circuit supplying a signal outputted from said signal source circuit to a light emitting element disposed at a position outside the semiconductor integrated circuit as a drive signal; and
   a light emitting element connecting terminal connected to the output end of said light emitting element driver circuit and to which the light emitting element is connected,
   wherein said signal source circuit, said light emitting element driver circuit, and said light emitting element connecting terminal are integrally formed on one semiconductor chip,
   said light emitting element driver circuit comprising;
   a first pair of MOS field effect transistors connected in a differential operating manner, to which a signal outputted from said signal source circuit is applied, and
   a current mirror circuit comprising a second pair of MOS field effect transistors, said second pair of MOS field effect transistors connected between the output side of one of said first pair of said MOS field effect transistors connected in differential operating manner and said light emitting element connecting terminal, wherein said light emitting element and one of the second pair of said MOS field effect transistors of said current mirror circuit are connected in series between power supply lines.

2. The integrated circuit according to claim 1, wherein a plurality of said light emitting element driver circuits, a plurality of said light emitting element connecting terminals, and a plurality of said signal source circuits are provided.

3. The integrated circuit-accordinq to claim 1, wherein said semiconductor chip is constituted by CMOSs.

4. A semiconductor integrated circuit comprising:
   a light receiving element connecting terminal supplied with a current outputted from a light receiving element disposed at a position outside the semiconductor integrated circuit;
   a current detector circuit the input end of which is connected to said light receiving element connecting terminal; and
   a signal processing circuit receiving a signal outputted from said current detector circuit to process it in a predetermined manner,
   wherein said light receiving light element connecting terminal, said current detector circuit, and said signal processing circuit are integrally formed on one semiconductor chip,
   said current detector circuit comprising two current mirror circuits each comprising two MOS field effect transistors, wherein a current outputted from said light receiving element is supplied to one current mirror circuit and a reference current is supplied to the other current mirror circuit.

5. The integrated circuit according to claim 4, wherein a plurality of said light receiving element connecting terminal, a plurality of said current detector circuit, and a plurality of said signal processing circuit are provided.

6. The integrated circuit according to claim 4, wherein said semiconductor chip is constituted by CMOSs.

7. A semiconductor integrated circuit comprising:
   a signal source circuit generating a signal to be transmitted;
   a light emitting element driver circuit supplying a signal outputted from said signal source circuit to a light emitting element disposed at a position outside the semiconductor integrated circuit as a drive signal;
   a light emitting element connecting terminal connected to the output end of said light emitting element driver circuit and to which the light emitting element is connected;
   a light receiving element connecting terminal supplied with a current outputted from a light receiving element disposed at a position outside the semiconductor integrated circuit;
   a current detector circuit the input end of which is connected to said light receiving element connecting terminal; and
   a signal processing circuit receiving a signal outputted from said current detector circuit to process it in a predetermined manner,
   wherein said signal source circuit, said light emitting element driver circuit, said light emitting element connecting terminal, said light receiving element connecting terminal, said current detector circuit, and said signal processing circuit are integrally formed on one semiconductor chip,
   said light emitting element circuit driver comprising:
   a first pair of MOS field effect transistors connected in a differential operating manner, to which a signal outputted from said signal source circuit is applied, and
   a current mirror circuit comprising a second pair of MOS field effect transistors, said second pair of MOS field effect transistors connected between the output side of one of said first pair of said MOS field effect transistors connected in differential operating manner and said light emitting element connecting terminal, wherein said light emitting element and one of the second pair of said MOS field effect transistors of said current mirror circuit are connected in series between power supply lines, and said current detector circuit comprising at least one current mirror circuit comprising two MOS field effect transistors.

8. The integrated circuit according to claim 7, wherein a plurality of said light emitting element driver circuits, a plurality of said light emitting element connecting terminal, a plurality of said signal source circuits, a plurality of said light receiving element connecting terminal, a plurality of said current detector circuit, and a plurality of said signal processing circuit are provided.

9. The integrated circuit according to claim 7, wherein said semiconductor chip is constituted by CMOSs.

10. A semiconductor integrated circuit comprising:

a signal source circuit generating a signal to be transmitted;

a light emitting element driver circuit supplying a signal outputted from said signal source circuit to a light emitting element disposed at a position outside the semiconductor integrated circuit as a drive signal; and a light emitting element connecting terminal connected to the output end of said light emitting element driver circuit and to which the light emitting element is connected, wherein said signal source circuit, said light emitting element driver circuit, and said light emitting element connecting terminal are integrally formed on one semiconductor chip, said light emitting element driver circuit comprising:

two MOS field effect transistors, one functioning as a current switch and the other serving as a variable resistor for setting the value of the drive current flowing through the one to any desired value, said two MOS field effect transistors being connected in series and a signal outputted from said signal-source circuit being applied to said MOS field effect transistor, and a current mirror circuit comprising two MOS field effect transistors and connected between the output side of said one MOS field effect transistor and said light emitting element connecting terminal, wherein said light emitting element and one of the two MOS field effect transistors of said current mirror circuit are connected in series between power supply lines.

11. The integrated circuit according to claim 10, wherein a plurality of said light emitting element driver circuits, a plurality of said light emitting element connecting terminals, and a plurality of said signal source circuits are provided.

12. The integrated circuit according to claim 10, wherein said semiconductor chip is CMOS.

13. A semiconductor integrated circuit comprising:

a signal source circuit generating a signal to be transmitted;

a light emitting element driver circuit supplying a signal outputted from said signal source circuit to a light emitting element disposed at a position outside the semiconductor integrated circuit as a drive signal;

a light emitting element connecting terminal connected to the output end of said light emitting element driver circuit and to which the light emitting element is connected;

a light receiving element connecting terminal supplied with a current outputted from a light receiving element connecting terminal supplied with a current outputted from a light receiving element disposed at a position outside the semiconductor integrated circuit;

a current detector circuit the input end of which is connected to said light receiving element connecting terminal; and a signal processing circuit receiving a signal outputted from said current detector circuit to process it in a predetermined manner, wherein said signal source circuit, said light emitting element driver circuit, said light emitting element connecting terminal, said light receiving element connecting terminal, said current detector circuit, and said signal processing circuit are integrally formed on one semiconductor chip, said light emitting element driver circuit comprising:

two MOS field effect transistors, one functioning as a current switch and the other serving as a variable resistor for setting the value of the drive current flowing through the one to any desired value, said two MOS field effect transistors being connected in series and a signal outputted from said signal source circuit being applied to said one MOS field effect transistor, and a current mirror circuit comprising two MOS field effect transistors and connected between the output side of said one MOS field effect transistor and said light emitting element connecting terminal, wherein said light emitting element and one of the two MOS field effect transistors of said current mirror circuit are connected in series between power supply lines, and said current detector circuit comprising at least one current mirror circuit comprising two MOS field effect transistors.

14. The integrated circuit according to claim 13, wherein a plurality of said light emitting element driver circuits, a plurality of said light emitting element connecting terminals, a plurality of said light emitting element connecting terminals, a plurality of said signal source circuits, a plurality of said light receiving element connecting terminal, a plurality of said current detector circuit, and a plurality of said signal processing circuit are provided.

15. The integrated circuit according to claim 13, wherein said semiconductor chip is CMOS.

16. A semiconductor integrated circuit comprising:

a light receiving element connecting terminal supplied with a current outputted from a light receiving element disposed at a position outside the semiconductor integrated circuit;

a current detector circuit the input end of which is connected to said light receiving element connecting terminal; and a signal processing circuit receiving a signal outputted from said current detector circuit to process it in a predetermined manner, wherein said light receiving element connecting terminal, said current detector circuit, and said, signal processing circuit are integrally formed on one semiconductor chip, said current detector circuit comprising at least two current mirror circuits, one comprising first and second N-channel MOS field effect transistors and the other comprising first and second P-channel MOS field effect transistors, wherein a current flowing through one of the two MOS field effect transistors of one current mirror circuit is supplied to said light receiving element and a reference current flows through the other MOS field effect transistor of said one current mirror circuit.

17. The integrated circuit according to claim 16, wherein a plurality of said light receiving element connecting terminal, a plurality of said current detector circuit, and a plurality of said signal processing circuit are provided.

18. The integrated circuit according to claim 16, wherein said semiconductor chip comprises CMOS.

19. A semiconductor integrated circuit comprising:

a light receiving element connecting terminal supplied with a current outputted from a light receiving element disposed at a position outside the semiconductor integrated terminal circuit;

a current detector circuit the input end of which is connected to said light receiving element connecting terminal; and a signal processing circuit receiving a signal outputted from said current detector circuit to process it in a predetermined manner, wherein said light receiving element connecting terminal, said current detector circuit, and said signal processing circuit are integrally formed on one semiconductor chip, said current detector circuit comprising:

a series circuit comprising a resistance element and a MOS field effect transistor, said series circuit being connected between power supply lines, said MOS field effect transistor being connected to said light receiving element connecting terminal, and at least one current mirror circuit comprising two MOS field effect transistors, wherein a voltage generated across said resistance element is applied to one of the two MOS field effect transistors of said current mirror circuit and a reference voltage is applied to the other MOS field effect transistor of said current mirror circuit.

20. The integrated circuit according to claim 19, wherein a plurality of said light receiving element connecting terminals, a plurality of said current detector circuits, and plurality of said signal processing circuits are provided.

21. The integrated circuit according to claim 19, wherein said semiconductor chip comprises CMOS.

\* \* \* \* \*

UNITED STATES PATENT AND TRADEMARK OFFICE
CERTIFICATE OF CORRECTION

PATENT NO.    : 6,396,610 B1
DATED         : May 28, 2002
INVENTOR(S)   : Toshiyuki Okayasu It is certified that error appears in the above-identified patent and that said Letters Patent is hereby corrected as shown below:

Title page,
Item [75], Inventor, delete "-gun".

Column 2,
Line 3, change "tc" to -- to --.
Line 11, change "forts" to -- forms --.

Column 3,
Line 24, change "scene" to -- scale --.

Column 4,
Line 20, change "The" to -- the --.

Column 5,
Line 59, change "P" to -- A --.

Column 6,
Line 36, change "3" to -- B --.

Column 7,
Line 32, change "thereinafter" to -- (hereinafter --.
Line 49, change "thp" to -- the --.
Line 63, change "teature" to -- feature --.

Column 8,
Line 65, change "singe" to -- since --.
Line 67, change "fight" to -- light --.

Column 9,
Line 4, no new paragraph.
Line 13, no new paragraph.

Column 10,
Line 41, change "multi-charnel" to -- multi-channel --.

Column 11,
Line 16, change "C26" to -- Q26 --.

UNITED STATES PATENT AND TRADEMARK OFFICE
CERTIFICATE OF CORRECTION

PATENT NO. : 6,396,610 B1
DATED : May 28, 2002
INVENTOR(S) : Toshiyuki Okayasu

It is certified that error appears in the above-identified patent and that said Letters Patent is hereby corrected as shown below:

Column 12,
Line 34, change "thus" to -- this --.
Line 61, change "Light" to -- light --.

Column 15,
Line 10, change "terminal" to -- terminals --.
Line 38, after "signal" delete "-".

Signed and Sealed this

Thirtieth Day of July, 2002

Attest:

Attesting Officer

JAMES E. ROGAN
Director of the United States Patent and Trademark Office